US012656696B2

(12) United States Patent
Kvon et al.

(10) Patent No.: US 12,656,696 B2
(45) Date of Patent: Jun. 16, 2026

(54) CONTAMINATION REDUCTION SYSTEM

(71) Applicant: ASML Netherlands B.V., Veldhoven (NL)

(72) Inventors: Vladimir Kvon, Eindhoven (NL); Andrei Mikhailovich Yakunin, Veldhoven (NL); Marcus Adrianus Van De Kerkhof, Helmond (NL); Dmitry Igorevich Astakhov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 380 days.

(21) Appl. No.: 18/260,878

(22) PCT Filed: Dec. 15, 2021

(86) PCT No.: PCT/EP2021/085835
§ 371 (c)(1),
(2) Date: Jul. 10, 2023

(87) PCT Pub. No.: WO2022/152491
PCT Pub. Date: Jul. 21, 2022

(65) Prior Publication Data
US 2024/0310742 A1 Sep. 19, 2024

(30) Foreign Application Priority Data
Jan. 15, 2021 (EP) .................................... 21151852

(51) Int. Cl.
G03F 7/00 (2006.01)
(52) U.S. Cl.
CPC ...... G03F 7/70916 (2013.01); G03F 7/70716 (2013.01); *G03F 7/70033* (2013.01)

(58) Field of Classification Search
CPC ............. G03F 7/70916; G03F 7/70716; G03F 7/70033; G03F 7/70558; G03F 7/7085
See application file for complete search history.

(56) References Cited

U.S. PATENT DOCUMENTS 7,875,864 B2 * 1/2011 Sogard ...................... G03F 1/82
34/275
9,268,031 B2 * 2/2016 Umstadter .......... G03F 7/70033
(Continued)

FOREIGN PATENT DOCUMENTS

EP 3 809 204 A1 4/2021
JP 2006-120776 A 5/2006
(Continued)

OTHER PUBLICATIONS

International Search Report and Written Opinion of the International Searching Authority directed to International Patent Application No. PCT/EP2021/085835, mailed Mar. 18, 2022; 11 pages.
(Continued)

*Primary Examiner* — Hung V Nguyen
(74) *Attorney, Agent, or Firm* — Finnegan, Henderson, Farabow, Garrett & Dunner LLP

(57) ABSTRACT

A contamination reduction system for reducing contamination of a patterning system in a plasma environment, comprising: a support arranged to hold a patterning system in a radiation beam; a shutter configured to shield a portion of the radiation beam from the patterning system; and an electrode positioned between the shutter and the support, the electrode connected to a voltage source and configured to generate an electric field between the electrode and the patterning system held by the support.

21 Claims, 7 Drawing Sheets

(56) References Cited

U.S. PATENT DOCUMENTS

| | | | |
|---|---|---|---|
| 10,338,477 B2 * | 7/2019 | Kim | G03F 7/70716 |
| 10,459,352 B2 * | 10/2019 | Chang | G03F 7/70925 |
| 10,678,149 B2 * | 6/2020 | Alvarado Castañeda | |
| | | | G03F 7/70908 |
| 11,086,224 B2 * | 8/2021 | Bai | G03F 7/70983 |
| 2002/0096647 A1 | 7/2002 | Moors et al. | |
| 2006/0017895 A1 | 1/2006 | Sogard | |
| 2008/0184584 A1 | 8/2008 | Sogard | |
| 2009/0128795 A1 | 5/2009 | Hayashi | |
| 2011/0143269 A1 | 6/2011 | Yakunin et al. | |
| 2013/0070218 A1 | 3/2013 | Ivanov et al. | |
| 2013/0235357 A1 | 9/2013 | Delgado et al. | |
| 2014/0253887 A1 | 9/2014 | Wu et al. | |
| 2018/0164694 A1 | 6/2018 | Kim et al. | |
| 2018/0188662 A1 | 7/2018 | Alvarado Castañeda | |
| 2020/0096880 A1 | 3/2020 | Nikipelov et al. | |
| 2020/0348599 A1 | 11/2020 | Bai et al. | |

FOREIGN PATENT DOCUMENTS

| | | | |
|---|---|---|---|
| JP | 2008-507848 | A | 3/2008 |
| JP | 2008-226973 | A | 9/2008 |
| JP | 2009-103693 | A | 5/2009 |
| JP | 2011-040464 | A | 2/2011 |
| TW | 2005-40561 | A | 12/2005 |
| TW | 2020-04363 | A | 1/2020 |
| TW | 2020-11452 | A | 3/2020 |
| WO | WO 2009/129960 | A1 | 10/2009 |
| WO | WO 2019/197128 | A2 | 10/2019 |
| WO | WO 2021/073817 | A1 | 4/2021 |

OTHER PUBLICATIONS

Japanese Office Action directed to Japanese Patent Application No. 2023-542911, mailed Oct. 14, 2025; 10 pages.

* cited by examiner

CONTAMINATION REDUCTION SYSTEM

CROSS-REFERENCE TO RELATED APPLICATIONS

This application claims priority of EP application 21151852.7 which was filed on Jan. 15, 2021 and which is incorporated herein in its entirety by reference.

FIELD

The present invention relates to a contamination reduction system. In particular, but not exclusively, it relates to a contamination reduction system for use in a plasma environment, for example in a lithographic environment.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask or reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

EUV radiation may contribute to the generation of contamination within the lithographic apparatus. For example, the EUV radiation may interact with matter present in the lithographic apparatus (e.g. small amounts of gas) to form a plasma. The plasma may provide suitably strong electrostatic force to release contaminant particles from surfaces within the lithographic apparatus. In general, increasing the power of the EUV radiation increases the number of particles that are released from surfaces by EUV generated plasma.

The contaminant particles may be transported to, and be incident upon, sensitive optical surfaces. For example, contaminant particles may be incident upon the patterning device (i.e. on the mask or reticle). Such contaminant particles may be imaged onto the substrate and disrupt the desired projected pattern, resulting in a defective product being manufactured by the lithographic apparatus. As another example, contaminant particles may damage components of the lithographic apparatus or objects present in the lithographic apparatus (e.g. they may rupture a pellicle that protects the reticle), thereby increasing the frequency of maintenance activity and reducing the throughput of the lithographic apparatus. It may therefore be desirable to mitigate one or more of the above problems.

SUMMARY

According to a first aspect of the invention there is provided a contamination reduction system for reducing contamination of a patterning system, comprising: a support arranged to hold a patterning system in a radiation beam; a shutter configured to shield a portion of the radiation beam from the patterning system; and an electrode positioned between the shutter and the support, the electrode connected to a voltage source and configured to generate an electric field between the electrode and the patterning system held by the support.

The electric field is such that at least one charged particle between the electrode and the patterning system is attracted by the electrode. The electric field is such that at least at least one charged particle is steered away from the patterning system. The charged particles may be contaminants. In one embodiment, the patterning system may comprise a substrate. In other embodiment the substrate may be a reticle, or, a reticle having a pellicle.

Such an arrangement may be used in a plasma environment. The plasma environment may be at least partially caused by the incidence of the radiation beam in the vicinity of the patterning device. As the electrode is shielded from the radiation beam, the electrode is located away from the main body of the plasma in the plasma environment and can hence be controllably biased. Furthermore, as the electrode is located between the shutter and the patterning system, a relatively small voltage is required to generate an electric field large enough to steer a particle away from the patterning system. A low voltage reduces the risk of arcs, especially in a plasma environment. Therefore, the present invention is suitable for reducing contamination of a patterning system located in a plasma environment.

When the patterning system is held by the support, the electrode is located between the shutter and the patterning system. That is, the electrode is located between the shutter and the patterning system when the patterning device is in use. In use the contamination reduction system may comprise the patterning system being illuminated by the radiation beam. The electrode may be placed between the shutter and the support but be electrically insulated from the shutter and the support. The electrode may not be in direct contact with the shutter or the support. The electric field may be generally perpendicular to the plane of the patterning system. The patterning system may act as a second electrode.

The support is arranged to hold a patterning system in a radiation beam. Therefore, the support is configured to hold a patterning system while a radiation beam is applied to the patterning system.

The electrode may be a single electrode. That is, there may be only a single electrode located between the shutter and the patterning system. The electric field may be generated between the single electrode and the patterning system, with the single electrode acting as a first electrode and the patterning system acting as a second electrode. Such an arrangement enables an electric field to be generated between the single electrode and the patterning system that reduces or prevents contamination without requiring a large amount of volume in the vicinity of the patterning system. This arrangement may hence be employed in small volumes without much volume penalty.

The electrode may be separably mounted with respect the support. The electrode may be moved separably to the support and patterning system. The electrode may be mechanically coupled to the shutter. The electrode may be movable with the shutter such that the electrode remains shielded from the radiation beam. The electrode may be moved to a location of the patterning system where it is desirable to reduce contamination.

The electric field may be less than 2 V/mm. Using such low electric fields reduces the chance of creating arcs, advantageously increasing the safety of the contamination reduction system. The voltage may additionally be less than 1 V/mm.

The generated electric field may be greater in magnitude than a predetermined value, the predetermined value representing a second electric field corresponding to an electric field at the patterning system when no voltage is applied to the electrode, and wherein the generated electric field and the second electric field are of opposite polarity.

By opposite polarity, it is meant that the generated electric field is directed in the opposite direction compared to the second electric field. In this way, the second electric field may be overcome by the generated electric field. As such, contaminants which would be attracted to the patterning system when no voltage is applied may be attracted by the electrode and diverted away from the patterning system when a voltage is applied. Such an electric field may be generated by selecting a voltage to be applied by the voltage source in dependence on the predetermined value.

The electric field at the patterning system may arise due the incidence of the radiation beam. The electric field at the patterning system may be due to the patterning system being in a plasma environment. At the patterning system may be considered to be in the vicinity of the patterning system, for example on or close to the surface of the patterning system which receives radiation from the radiation beam. More than one predetermined value may be used.

The contamination reduction system may further comprise means for measuring the electric field at the patterning system. The predetermined value may comprise the measured electric field. For example, the contamination reduction system may comprise a sensor. The electric field may be measured at a surface of the patterning system and/or in an area proximal to the surface. By measuring empirically, the electric field with no voltage applied to the electrode may be accurately overcome by application of a voltage calculated based thereupon.

The contamination reduction system may further comprise a memory for storing the predetermined value. The predetermined value may be calculated for example from theoretical analysis and/or modelling. The predetermined value may correspond to one or more empirically measured electric field values.

The predetermined value may comprise a function which varies with time. A voltage applied by the voltage supply may be varied with time and may be selected in dependence on the predetermined value. That is, the generated electric field may be varied with time. The applied voltage may be continuously variable. The varied voltage may enable a lower voltage to be applied while still reducing contamination.

The contamination reduction system may further comprise a control device operable to control the voltage applied by the voltage source.

The contamination reduction system may further comprise a gas outlet configured to provide a gas to a surface of the patterning system arranged to be illuminated by the radiation beam. The gas outlet may generate a gas curtain inhibiting neutral contaminant particles and/or particles which are not electrically charged reaching the patterning system.

The gas outlet and electrode may be unitary. That is, the gas nozzle may comprise the electrode. Beneficially this allows an electrode to be incorporated into a patterning system with little to no volume penalty, as surfaces with other beneficial uses within the patterning system can be provided with dual functionality.

The contamination reduction system may further comprise a cooling system configured to remove heat from the electrode. By providing a cooling system, any heat build-up, for example due to interaction with the plasma environment, may be removed. Removal of heat may reduce damage of the electrode and/or reduce the risk of adhered contaminants on the electrode being released. Removal of heat may increase the lifetime of the contamination reduction system.

The electrode may comprise a flat surface extending generally parallel to the plane of the patterning system and/or shutter. An electrode with this structure may experience negligible mechanical damage due to induced electric fields. The electrode may have a thickness perpendicular to the plane of the patterning system and/or shutter on the order of millimeters. Parallel/perpendicular to the plane of the patterning system should be interpreted in relation to the patterning system when held by the support in normal use.

The electrode may comprise a first portion and a second portion electrically isolated from the first portion. A different voltage may be applied to each of the first and second portion. As such, additional contaminant steering may be performed, for example because additional electric fields with different polarities/directions may be generated.

According to a second aspect of the invention there is provided a reticle stage comprising the contamination reduction system of any embodiment of the first aspect of the invention.

According to a third aspect of the invention there is provided a lithographic apparatus comprising the reticle stage of the second aspect of the invention and/or the contamination reduction system of any embodiment of the first aspect of the invention.

According to a fourth aspect of the invention there is provided a method of preventing contamination of a patterning system, the patterning system held in a radiation beam and a portion of the patterning system being shielded by the radiation beam by a shutter, the method comprising applying a voltage to an electrode positioned between the shutter and the patterning system such that an electric field is generated between the electrode and the patterning system.

A support is arranged to hold a patterning system in a radiation beam. Therefore, the support is configured to hold a patterning system while a radiation beam is applied to the patterning system.

The electric field is such that at least one charged particle between the electrode and the patterning system is attracted by the electrode. The electric field is such that at least at least one charged particle is steered away from the patterning system. The charged particles may be contaminants.

Such an arrangement may be used in a plasma environment. The plasma environment may be at least partially caused by the incidence of the radiation beam in the vicinity of the patterning device.

The voltage applied may be such that the generated electric field is greater in magnitude than a predetermined value, the predetermined value representing a second electric field corresponding to an electric field at the patterning system when no voltage is applied to the electrode, and wherein the generated electric field and the second electric field are of opposite polarity.

By opposite polarity, it is meant that the generated electric field is directed in the opposite direction compared to the second electric field. In this way, the second electric field may be overcome by the generated electric field. As such, contaminants which would be attracted to the patterning system when no voltage is applied may be attracted by the electrode and diverted away from the patterning system when a voltage is applied. Such an electric field may be generated by selecting a voltage to be applied by the voltage source in dependence on the predetermined value.

The electric field at the patterning system may arise due the incidence of the radiation beam. The electric field at the patterning system may be due to the patterning system being in a plasma environment. At the patterning system may be considered to be in the vicinity of the patterning system, for example on or close to the surface of the patterning system which receives radiation from the radiation beam. More than one predetermined value may be used.

The method may further comprise measuring the electric field at the patterning system when no voltage is applied to the electrode. Alternatively the electric field at the patterning system when no voltage is applied may be calculated theoretically. The method may optionally further comprise storing the measured or calculated electric field.

Applying the voltage may comprise applying a first voltage during a first time interval and applying a second voltage during a second time interval, wherein the first voltage and second voltage are different.

The voltage may be varied as a function of a characteristic of the radiation beam, which itself may vary with time. For example, the variation may be a function of a pulse rate and/or power of the radiation beam. By applying a varied voltage, the generated electric field may be tailored to a varying electric field which arises due the incidence of the radiation beam. The varied voltage may enable a lower voltage to be applied while still reducing contamination. The voltage may be varied in dependence of an electric field experienced in the vicinity of the patterning system and/or a biasing experienced by the patterning system, for example due to the incident radiation beam.

The first voltage may have a first polarity and the second voltage may have a second polarity opposite the first polarity. Reversing the polarity may encourage one or more contaminants to be released from the surface of the electrode. The release of one or more contaminants may be beneficial for cleaning and/or metrology purposes.

A dummy substrate may be introduced such that released contaminants may adhere to the dummy substrate. Such a dummy substrate may reduce the risk of released contaminants adhere to other components, for example the patterning system. Such a dummy substrate may be used for subsequent metrology procedures, for example by sensing one or more characteristics of the contaminants of the surface of the dummy substrate.

According to a fifth aspect of the invention there is provided a metrology system for determining contamination characteristics in a plasma environment, comprising any embodiment of the contamination reduction system of the first aspect of the invention and a sensing apparatus, the sensing apparatus operable to determine one or more characteristics of one or more contaminant particles on a surface of the electrode.

Such a metrology system may be used to better understand characteristics of contamination in a plasma environment, for example in a lithographic apparatus.

The characteristic comprises a volume and/or density and/or composition of the one or more contaminant particles.

It will be appreciated that features described in respect of one aspect or embodiment may be combined with any features described in respect of another aspect or embodiment and all such combinations are expressly considered and disclosed herein.

BRIEF DESCRIPTION OF THE DRAWINGS

Embodiments of the invention will now be described, by way of example only, with reference to the accompanying schematic drawings, in which.

DETAILED DESCRIPTION

Figure 1:
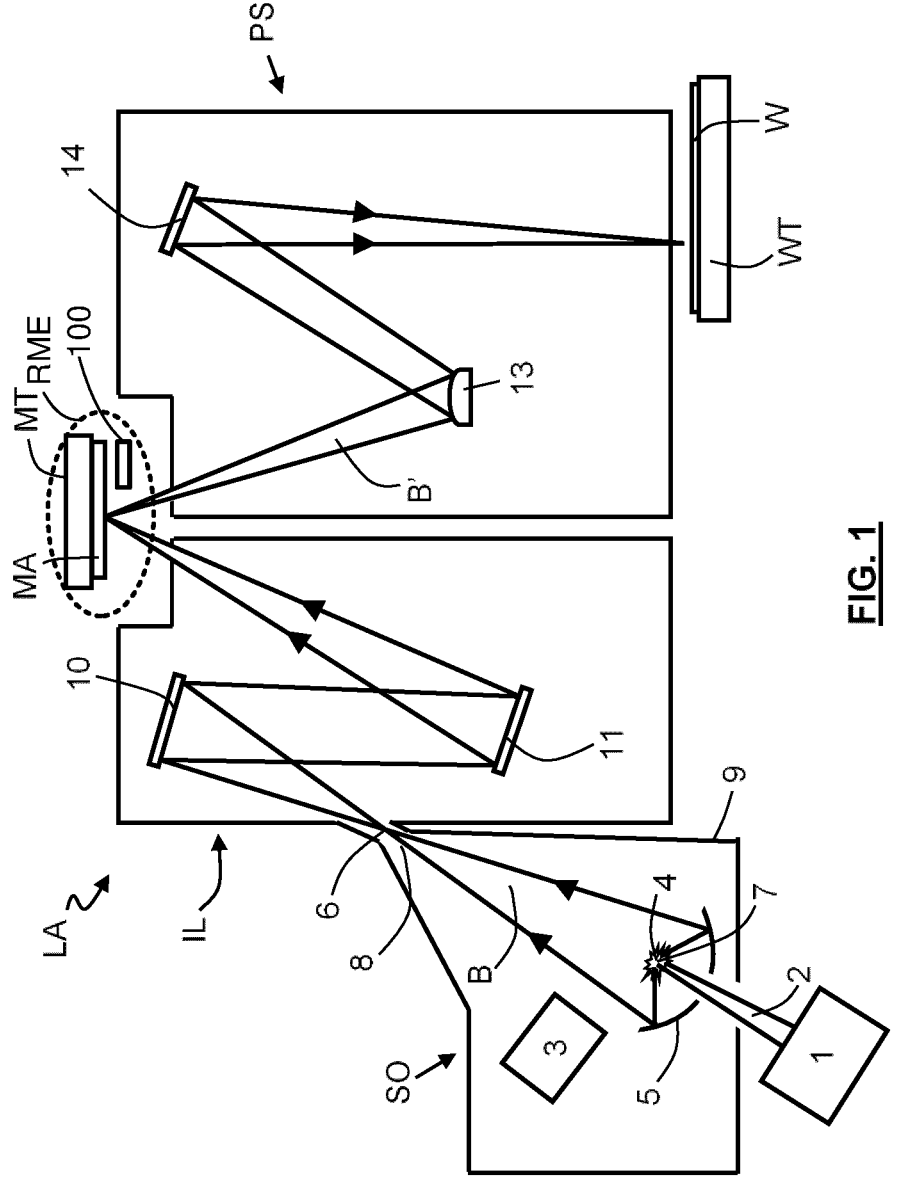
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

A pellicle (not depicted) may be attached to the patterning device MA (e.g. via a pellicle frame). The patterning device, pellicle and pellicle frame MA may be referred to as a patterning system. Additional components are provided in the vicinity of the patterning device MA, in a region referred to as a reticle mini environment RME. The additional components are provided to further condition the radiation beam B, for example shutters (not shown) which may also be referred to as blades. A contamination reduction system is also provided to reduce the likelihood of contamination particles being transported to and adhering to the patterning device MA. The contamination reduction system includes an electrode 100.

After being conditioned, the EUV radiation beam B interacts with the patterning device MA. As a result of this interaction, a patterned EUV radiation beam B' is generated.

The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

Figure 2A:
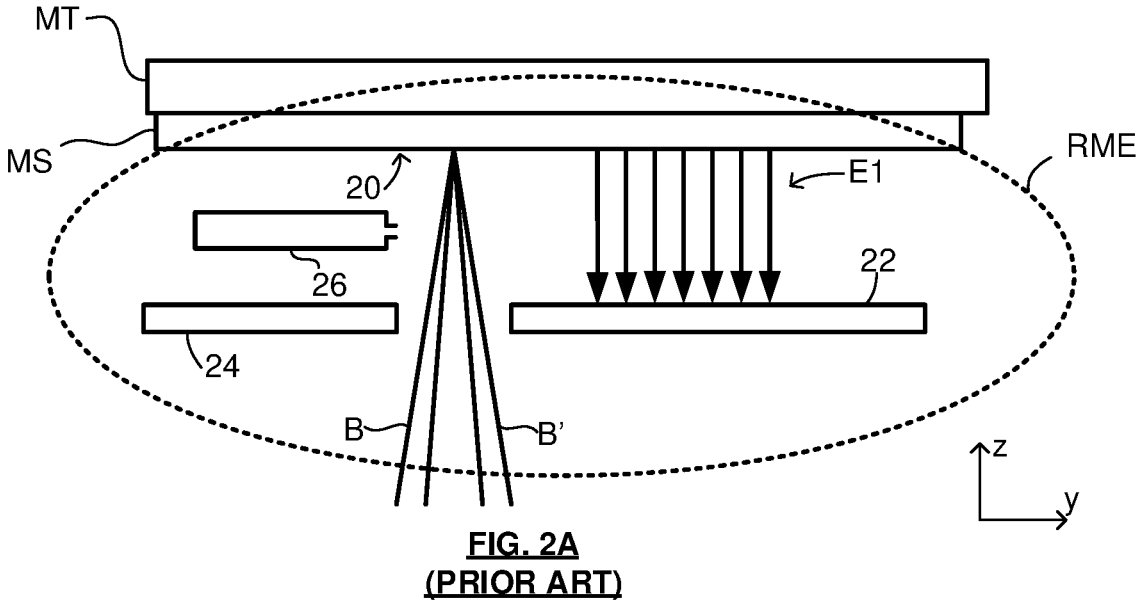
FIG. 2A schematically depicts a reticle mini environment of a conventional apparatus.

FIG. 2A schematically depicts the reticle mini environment RME of a conventional lithographic apparatus. The reticle mini environment RME includes a patterning system MS supported by a support structure MT. As described above, the patterning system may comprise a patterning device and a pellicle. The support structure MT is operable to be scanned with respect to the radiation beam B, for example in the plane of the support structure MT (i.e. the y-direction as indicated in FIG. 2). In this way, the support structure MT, and hence the patterning system MS, can be scanned such that different portions of the pattern upon the patterning device can be recorded in the patterned radiation beam B'.

A shutter system, comprising first and second shutters 22, 24, is provided in the reticle mini environment RME. The shutters 22, 24 may be used to control an area of the radiation beam B that is incident upon the patterning system MS (e.g. to control the size of the radiation beam in the y-direction). The shutters 22, 24 may also be used to periodically block the radiation beam B and prevent it from being incident upon the patterning system MS (e.g. in between scanning exposures of a substrate). It should be understood that the shutter system depicted in FIG. 2 is a simplified illustration and a shutter system may take a different form. For example, more or fewer shutters may be used in a shutter system, and the shutter(s) may take any shape. The movement of the shutter(s) in a shutter system is typically controlled by a control module.

The reticle mini environment RME includes a gas nozzle 26. The gas nozzle 26 provides gas to the reticle mini environment RME, and in particular to the surface of the patterning system MS which is to be illuminated by the radiation beam B. Airborne contaminant particles, known as contaminants, may be present in the reticle mini environment RME. Contaminants typically have diameters on the order of nanometers to micrometers. The gas provided by the gas nozzle 26 forms a gas curtain which acts to inhibit contaminant particles from travelling to, and adhering to, the patterning system MS (e.g. to the patterning device or to a pellicle attached to the patterning device). Hydrogen gas is typically used. The gas is typically provided in the vicinity of a surface 20 of the patterning system MS which is illuminated by radiation.

During a lithographic process, the patterning system MS and reticle mini environment RME are exposed to radiation due to illumination by the radiation beam B. Gas in the reticle mini environment RME is hence illuminated by the radiation beam and becomes ionized, forming a plasma. The plasma may extend through some or all of the reticle mini environment RME, and hence the reticle mini environment RME may be referred to as being a plasma environment. The plasma environment may subsist when the radiation beam B is incident, and may additionally subsist for a period of time after the radiation beam B is no longer incident. Due to the plasma environment, contaminants, which were previously suspended in a neutral gas, are now in a plasma environment. The contaminants in the plasma environment become charged due to charged species (e.g. ions, electrons) in the plasma. Typically, contaminants become negatively charged.

Due to charging in the reticle mini environment RME, an electric field arises. In particular, the patterning system MS typically becomes positively charged and an electric field E1 is established between the shutter 22 and the patterning system MS. The electric field E1 is such that negatively charged contaminants are driven towards the patterning system MS, encouraging contaminants to adhere to the patterning system MS. In particular, contaminants may adhere to the surface 20 of the patterning system MS which may comprise a surface of the patterning device or a surface of a pellicle (if a pellicle is present). Contamination on either the patterning device or the pellicle (i.e. on the patterning system MS) can negatively affect imaging quality of the lithographic apparatus. The electric field E1 is typically strong enough that the force exerted on contaminants by the electric field E1 is greater than any force exerted by the gas curtain provided by the gas nozzle 26, therefore the electric field E1 overcomes the contamination preventing capabilities of the gas curtain.

Figure 2B:
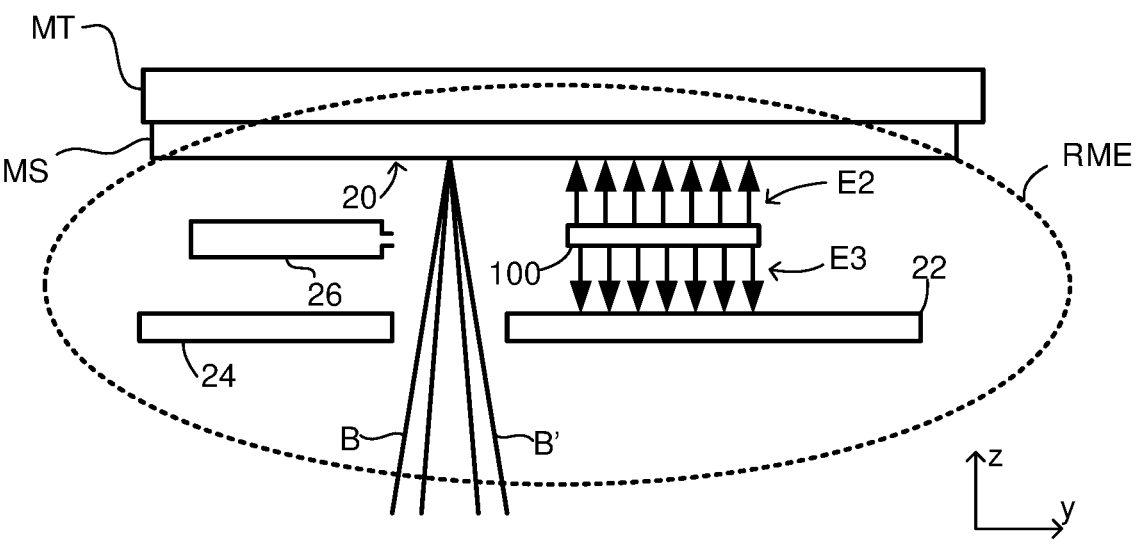
FIG. 2B schematically depicts a reticle mini environment according to an embodiment of the invention.

FIG. 2B schematically depicts a reticle mini environment RME of a lithographic apparatus according to an embodiment of the invention. An electrode 100 is provided between the shutter 22 and the patterning system MS. The electrode 100 is connected to a voltage supply (not shown) and is therefore biased. The difference in potential between the electrode 100 and the patterning system MS is configured, for example by controlling the voltage provided to the electrode 100, such that an electric field E2 is established between the electrode 100 and the patterning system MS. In this arrangement, the patterning system MS acts as a second electrode which forms an electrode pair with the (first) electrode 100. An electric field E2 arises between the patterning system MS (second electrode) and the (first) electrode 100. The electric field E2 exerts a force on charged contaminants. As a result, contaminants can be steered and, in particular, may be steered away from the patterning system MS.

In this example arrangement, the electrode is biased with a voltage which is positive relative to the patterning system MS. For example, the patterning system MS may be grounded, in which case the electrode 100 may have any positive potential difference. Alternatively, the patterning system MS may have some bias, for example due to accumulated static charge, in which case the electrode 100 may have a more positive (or less negative) potential difference with respect to any bias upon the patterning system MS. As a result, negatively charged contaminants are attracted by the electrode 100. As such, contaminants may be steered away from the patterning system MS due to the force exerted by the electric field E2.

In another example, the electrode may be biased with a voltage of opposite polarity, for example negative relative to the patterning system MS. In this example, the electric field will be reversed in direction and hence positively charged contaminants may be attracted by the electrode 100. As such, the polarity of the bias applied to the electrode may be tailored based on the specific plasma environment in which it is utilized.

FIGS. 2C, 2D, 2E and 2F schematically illustrate the movement of negatively charged contaminants 27, 28 in a portion of the arrangement illustrated in FIG. 2B when the patterning system MS is in a plasma environment, for example following illumination by a radiation beam. The illustrated contaminants 27, 28 are located between the electrode 100 and the patterning system MS.

Figures 2C, 2D, 2E, 2F:
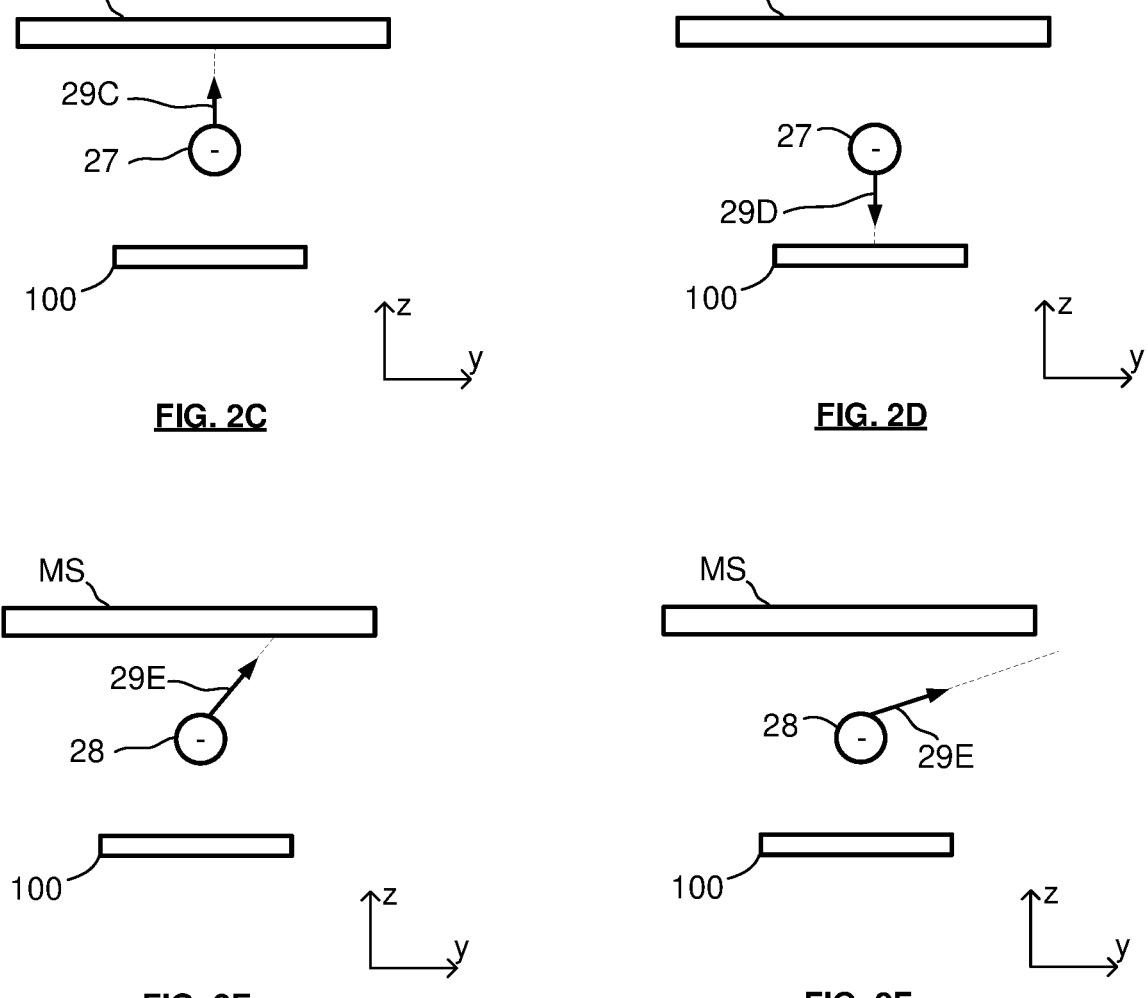
FIGS. 2C, 2D, 2E and 2F schematically illustrate the movement of negatively charged contaminants in a portion of the arrangement illustrated in FIG. 2B.

FIG. 2C depicts the movement of a first contaminant 27 when no voltage is provided to the electrode 100. In this example, the contaminant 27 has an initial velocity 29C in a direction towards the patterning system MS. In the frame of reference indicated in FIG. 2C, this initial velocity 29C is in the positive z-direction. Without contamination reduction measures, the contaminant 27 would travel to the patterning system MS, as indicated by a dashed line, and contaminate the patterning system MS. The initial velocity 29C is, at least in part, due to an electric field which arises as described with reference to FIG. 2A. That is, due to charging in the plasma environment, an electric field is established between the shutter (not shown) and the patterning system MS such that the negatively charged contaminant 27 is attracted towards the patterning system MS.

FIG. 2D depicts the movement of the contaminant 27 of FIG. 2C when a voltage is provided to the electrode 100. The voltage that is applied is large enough to reverse the direction of the electric field between the electrode 100 and the patterning system MS compared to the electric field which arose with no bias applied to the electrode 100. The electric field generated by the electrode 100 is large enough to effect a change in the direction of travel of the contaminant 27. The contaminant 27 has an updated velocity 29D which is directed towards the electrode 100, i.e. in the negative z-direction. The contaminant 27 will subsequently travel to the electrode 100 as indicated by a dashed line. In this way, the application of a voltage to the electrode 100 will steered the contaminant away from the patterning system MS by attracting it to the electrode 100.

Once the contaminant 27 has travelled to the electrode 100, it may adhere to the electrode, thereby converting it from an airborne particle to a particle localized upon a surface. By localizing contaminants on the electrode 100, they are unable to recirculate around the reticle mini environment RME and travel to/adhere to the patterning system MS. Whether or not a contaminant adheres to the electrode may depend on the material properties of the contaminant and the electrode and/or the surface state of the electrode.

FIG. 2E depicts the movement of a second contaminant 28 when no voltage is provided to the electrode 100. In this example, the contaminant 28 has an initial velocity 29E with a component in a direction towards the patterning system MS (i.e. in the positive z-direction) and a component in a direction transverse to the patterning system MS (i.e. in the positive y-direction). The component of the initial velocity 29E in the direction towards the patterning system MS is, at least in part, due to an electric field which arises as described with reference to FIG. 2A. The component of the initial velocity 29E in the transverse direction may be due to other aspects of the environment, for example forces exerted by the plasma environment and/or gas pressure from a gas nozzle.

FIG. 2F depicts the movement of the contaminant 28 of FIG. 2E when a voltage is provided to the electrode 100. The voltage that is applied is large enough to reverse the direction of the electric field between the electrode 100 and the patterning system MS compared to the electric field which arose with no bias applied to the electrode 100. The electric field generated by the electrode 100 is large enough to effect a change in the direction of travel of the contaminant 28. The contaminant 28 has an updated velocity 29E which has a component in a direction towards the patterning system MS which is smaller in magnitude compared to the component in the initial velocity 29C. However, the transverse component of the updated velocity 29E is relatively unaffected by the electric field. As a result, the contaminant 28 will continue to travel towards a plane in which the patterning system MS is located, as indicated by the dashed line, but misses the patterning system MS. That is, the contaminant 28 is steered away from the patterning system MS such that it does not travel directly towards or impinge upon the patterning system MS. In this situation, the contaminant 28 experiences attraction by the electrode 100, but does not travel towards the electrode 100.

In the above described examples of particle steering, with reference to FIGS. 2D and 2F, the contaminant experiences attraction by an electrode and is hence steered away from the patterning system. As a result, the provision of an electrode as part of a contamination reduction system reduces the chance that contaminants will travel towards and be deposited on the patterning system.

The electrode 100 is located in a region of the patterning system MS which is not illuminated by radiation via the radiation beam B. In particular, the electrode 100 is shielded from radiation by the shutter 22. As a result, it is spatially removed from the main body of the plasma generated by the radiation beam. As such, any damage to the electrode 100, for example due to heating, is reduced. Furthermore, any contaminants which have adhered to the electrode 100 are less likely to be re-released when the electrode 100 is shielded from the radiation beam B.

The shutter 22 may also act as a (third) electrode, and another electric field E3 may arise between the electrode 100 and the shutter 22. This occur due to a potential difference between the shutter 22 and the electrode 100, for example if the shutter 22 is grounded and the electrode 100 is biased as described above. Contaminants may be steered by this electric field E3 in the same way as described above. In an example where the electrode 100 is biased more positively than any bias on the shutter 22, negatively charged contaminants may be steered away from the shutter 22 and towards the electrode 100.

Figure 3:
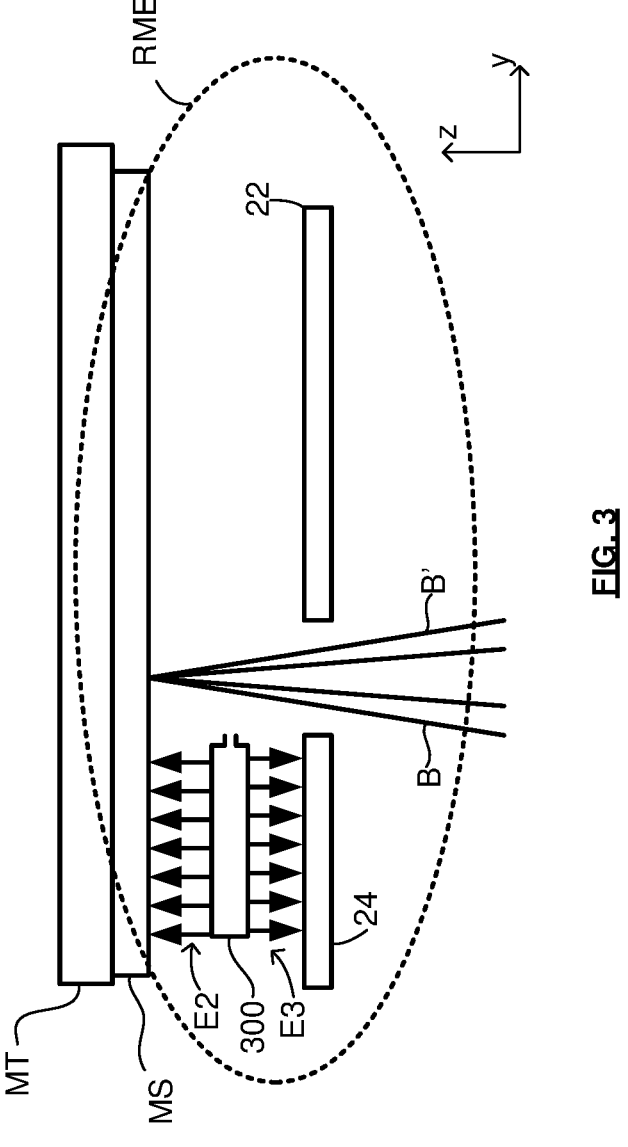
FIG. 3 depicts an alternative arrangement of a reticle mini environment according to an embodiment of the invention.

FIG. 3 depicts an alternative arrangement of a reticle mini environment RME of a lithographic apparatus according to an embodiment of the invention. Many features of FIG. 3 correspond to that of FIG. 2B and are numbered accordingly.

The arrangement depicted in FIG. 3 comprises a gas nozzle 300 located between a shutter 24 and a patterning system MS. The gas nozzle 300 is connected to a voltage supply (not shown) and, as such, the gas nozzle 300 acts as an electrode. In this arrangement, an electric field E2 arises between the gas nozzle 300 and the patterning system MS as described above with reference to the electrode 100 of FIG. 2B. A corresponding electric field E3 may arise between the gas nozzle 300 and the shutter 24. When a voltage is applied to the gas nozzle 300 that is more positive than any bias on the patterning system MS and shutter 24, the electric fields E2, E3 steer negatively charged contaminants due to attraction by the gas nozzle 300. Therefore, contamination reaching the patterning system MS is reduced by diverting contaminants away from the patterning system MS and securing contaminants to the gas nozzle 300.

As described above, in some arrangements an electrode can accumulate contaminants upon its surface as contaminants may be deposited upon the electrode surface if the attraction is such that the contaminants travel to the electrode, for example as illustrated in FIG. 2D. Said contaminants may be studied to determine more information regarding the contamination in the plasma environment. In particular, the surface of an electrode with adhered contaminants may be investigated to determine one or more characteristics of the contaminants, for example the chemical composition or density of contaminants. Known metrology methods may be used upon the surface of the electrode, for example scanning electron microscopy (SEM), x-ray photoelectron spectroscopy (XPS), energy dispersive x-ray spectroscopy (EDS), atomic force microscopy (AFM), secondary ion mass spectrometry (SIMS), profilometry, ellipsometry Metrology means may also be implemented within the plasma environment, for example a metrology apparatus may be positioned in a lithographic apparatus such that it can measure properties of the electrode and/or contaminants thereon, and determine characteristics associated with the contaminants, with the electrode in situ. Alternatively, metrology means may be used upon the electrode and/or contaminants after removing the electrode from its 'in-use' position, for example after removing it from the plasma environment.

Contaminants may additionally or alternatively be removed from the surface of the electrode and studied once removed. Studying contaminants following removal from the electrode may provide information regarding the characteristics of the contaminants, Known metrology methods may be used to study the contaminants, for example using particle mass classification (PMC), SEM, EDS, AFM, or transmission electron microscopy (TEM).

Contaminants may be removed from the surface of the electrode by reversing the polarity of the voltage applied to the electrode. For example, if a negative voltage is applied to the electrode to attract contaminants to the electrode which results in deposition of contaminants on the electrode surface, then the application of a positive voltage to the electrode may cause contaminants to be released from the electrode. Whether or not a contaminant is released from the electrode may depend on the material properties of the contaminant and the electrode and/or the surface state of the electrode. When releasing contaminants, a dummy substrate may be positioned close to the electrode such that the contaminants adhere to this dummy substrate. The dummy substrate may then be analyzed for metrology purposes. Additionally or alternatively, the dummy substrate may be provided simply to reduce the risk of contaminants adhering to other components within the environment, for example the patterning system MS.

Any magnitude of electric field between the electrode and patterning system, will cause contaminants to be attracted by the electrode as a force will be exerted upon the contaminant. The voltage may be selected such that the force upon a contaminant due to the electric field is large enough to steer the contaminant away from the patterning system, or a portion thereof. In some instances the voltage may be selected such that the force is large enough to effect a change in direction of a contaminant particle, such that it reverses and travels towards the electrode, for example as described with reference to FIGS. 2C and 2D. In some instances, the voltage may be selected such that the force is large enough to alter the velocity vector so the contaminant misses the patterning system, for example as described with reference to FIGS. 2E and 2F. In some instances it may be beneficial to select the voltage so that the force acting upon contaminants exceeds other forces which they may experience, for example drag (e.g. against neutral particles within the plasma environment) and Coulombic forces (e.g. due to plasma Coulomb fields in the plasma environment).

The voltage may also be selected to be low enough that the risk of arcs are reduced. The electrode in its location between the shutter and the patterning system is in close proximity to the patterning system, so the application of an electric field strong enough to deflect contaminants can be achieved at relatively low voltages, e.g. in the range 0-10 V.

In a first example, a static voltage is applied. By static, it is meant that the voltage applied to the electrode 100 is generally constant. In a second example, a dynamic voltage is applied. By dynamic, it is meant that the voltage varies, for example varying over time. These examples and their effects are described below in more detail.

Figure 4:
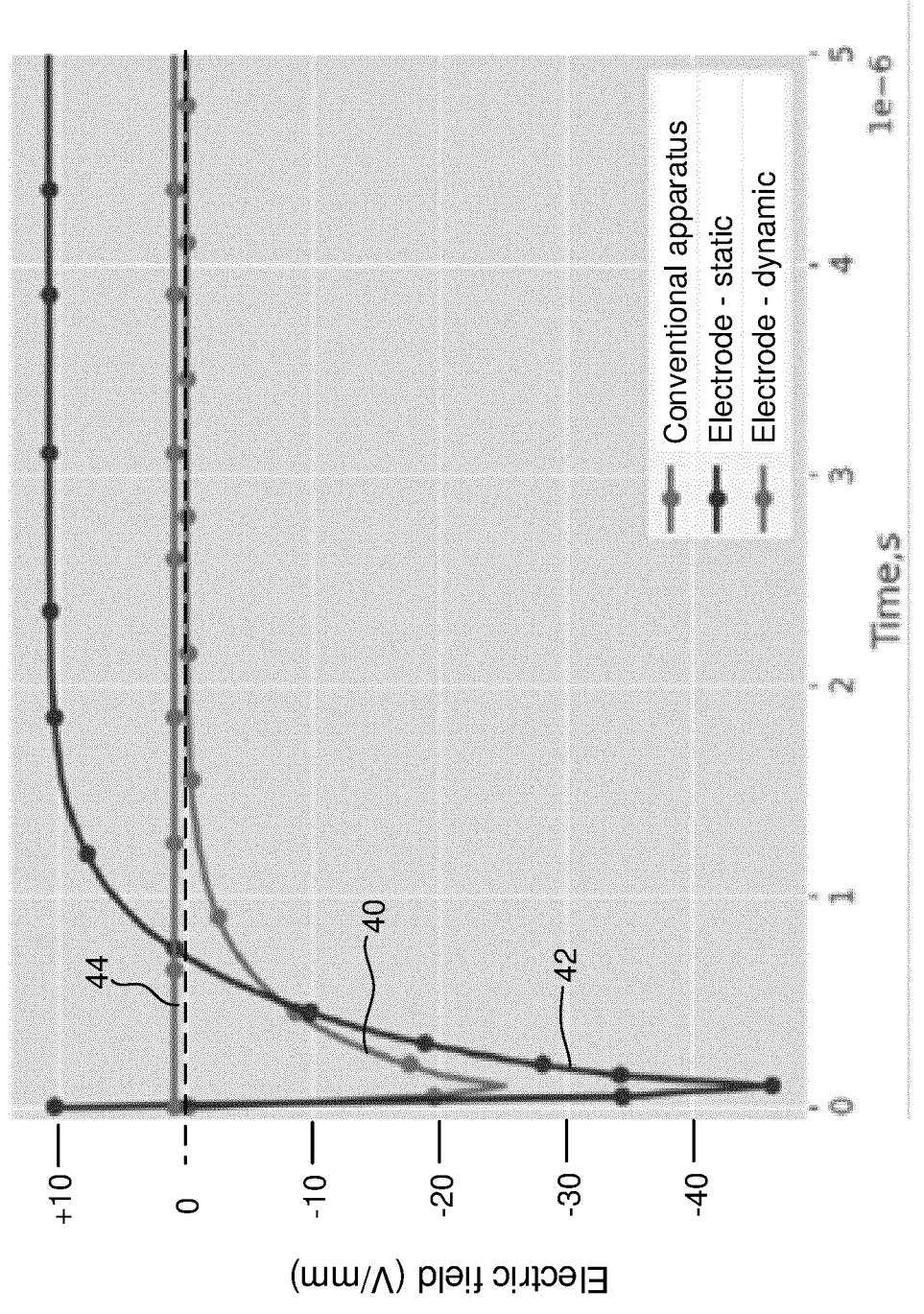
FIG. 4 shows curves representing the electric field profile within the plasma environment in a region of interest.

FIG. 4 shows curves representing the electric field profile within the plasma environment in a region of interest. The region of interest is in the reticle mini environment, in a location proximal to the surface 20 of a patterning system MS similar to that described with reference to FIG. 2B. In particular, for curves representing the electric field profile in a system according to the present invention, the region of interest is located between an electrode (e.g. electrode 100) and the surface (e.g. surface 20). For a curve representing the electric field profile in a conventional system (for example that depicted in FIG. 2A), the region of interest is in a corresponding location with no electrode present, for example the region where the electric field E1 is depicted in FIG. 2A.

The electric field is shown on the vertical axis. The electric field is depicted with negative values and positive values to represent the directionality of the electric field. It should be understood that an electric field cannot be positive or negative and this wording is representative of directionality with respect the patterning system and electrode. A negative electric field corresponds to a field which attracts negatively charged contaminants to the patterning system. A positive electric field corresponds to a field which steers negatively charged contaminants away from the patterning system. Zero electric field (i.e. no electric field) is shown with a dashed line. With reference to FIGS. 2A and 2B, the electric field E1 in FIG. 2A may be represented as a negative electric field which has a direction in the negative z-direction whereas the electric field E2 in FIG. 2B may be represented as a positive electric field which has a direction in the positive z-direction.

The electric field profile is shown over time, starting from a zero-point where a pulse of radiation illuminates the patterning system (for example after shutters have been opened, allowing the radiation beam to travel to the patterning system). The electric field profile is subsequently shown for 5 μs following this initial pulse. The pulse has a pulse duration on the order of hundreds of nanoseconds or shorter.

A first curve 40 shows the electric field profile in a region of interest of a conventional apparatus with no electrode. The electric field increases rapidly in magnitude from 0 seconds to a peak negativity of magnitude 25 V/m at 100 ns. The electric field subsequently reduces in magnitude, slowly approaching a magnitude of zero over the window of 5 μs. The electric field does not become positive. Therefore, negatively charged contaminants in this arrangement are strongly attracted to the patterning system for the first few hundred nanoseconds, and continue to be weakly attracted to the patterning system (when the electric field is weakly negative) or not acted upon (when the electric field has a magnitude of zero) thereafter.

A second curve 42 shows the electric field profile in a region of interest of an apparatus with an electrode, when a static voltage is applied. In particular, the apparatus in question is arranged similarly to that depicted in FIG. 2B, with a spacing between the electrode 100 and the surface 20 of the patterning system MS of approximately 5 mm. The electric field in the region of interest increases rapidly in magnitude from 0 seconds to a peak negativity of magnitude approximately 45 V/m around 100 ns. This peak is strongly negative compared to the conventional apparatus for the duration of the pulse. That is, negatively charged contaminants are strongly attracted to the patterning system for the duration of the pulse. The electric field subsequently decreases in magnitude between 100 ns and approximately 700 ns. At around 700 ns, the electric field becomes positive and steadily increases in positive magnitude until it plateaus at a positive maximum magnitude of around 10 V/m around 2 ms. The electric field remains at this positive maximum for the full window of 5 μs. During the time in which the electric field is positive, negatively charged particles are attracted by the electrode. As such, despite initially being attracted to the patterning system for a short period of time, by applying a static voltage to the electrode, negatively charged contaminants can be steered away from the patterning system for a significant period of time within the window of 5 μs.

A third curve 44 shows the electric profile in a region of interest of an apparatus with an electrode, when a dynamic voltage is applied. The apparatus and region of interest are the same for the third curve 44 and the second curve 42.

The third curve 44 is slightly positive for the full window of 0 seconds to 5 μs. That is, when a dynamic voltage is applied, the voltage can be tailored such that the electric field is constantly positive. As such, using a dynamic voltage applied to an electrode, negatively charged contaminants can be constantly steered away from a patterning system.

The dynamic voltage is arranged so that the voltage V(t) applied to the electrode varies over time t. Such variation may be represented according to equation (1):

$$V(t) = f(E(t)) \tag{1}$$

Where f( . . . ) denotes a function and E(t) denotes the variation of the electric field overtime t with no voltage applied to the electrode. The electric field E(t) may be an estimated value, based on theoretical calculations (e.g. analytically) or empirical data (e.g. by measuring a potential at the patterning device). The electric field E(t) may be, for example, the electric field which naturally arises in a plasma environment (e.g. electric field E1 in FIG. 2A).

In a specific example, the voltage is calculated to generate the electric field E(t) such that the electric field contributing to attracting contaminants by the electrode is always greater than any electric field contributing to attracting contaminants by the patterning device. As a result, the overall electric field in the region of interest will always be positive in the reference frame used in FIG. 4.

In this example, a voltage may be selected such that it creates a potential $\varphi_c$ at the electrode which fulfils equation 2:

$$\varphi_e = \varphi_{ps} + \delta\tilde{\varphi} \tag{2}$$

$\varphi_{ps}$ is the potential at or in the vicinity of the patterning system which occurs when no voltage is applied to the electrode. The potential $\varphi_{ps}$ may be calculated theoretically or measured empirically. $\tilde{\varphi}$ is an offset which may be selected to affect the overall electric field strength in the region of interest, for example a greater offset $\tilde{\varphi}$ may impart a greater change in momentum to contaminants, steering them away from the patterning system with greater speed.

The offset C can be calculated according to $$E_{avg} = -\frac{\delta\varphi}{\delta z},$$

where $E_{avg}$ is the average electric field strength in the region of interest with no applied voltage at the electrode, and is calculated based on the variation of potential δφ in the z-direction (δz) when no voltage is applied to the electrode. The potentials $\varphi_e$, $\varphi_{ps}$ represented in equation 2 are functions of time.

In a specific example, a sensor is located in the vicinity of the patterning system. The sensor is used to monitor the electric field (and/or potential $\varphi_{ps}$) at the patterning system. Data can be collected monitoring how the electric field at the patterning system changes over time, for example due to incident radiation and/or other changes in the plasma environment. The dynamic voltage may hence be calculated based on data obtained by the sensor. The sensor may be located upon the patterning system or may form part of the patterning system.

In another example, the electric field (and/or potential $\varphi_{ps}$) at the patterning system may be calculated theoretically and stored in a memory. Electric field values may be calculated over a period of time, for example in response to changes in the plasma environment and/or due to incident radiation.

Whether electric field values are sensed or calculated theoretically, they may be stored as predetermined electric field values. These predetermined electric field values may hence be used to calculate a voltage or voltage profile (i.e. varying voltage) to be provided to the electrode.

Different functions other than equations (1) and (2) may be selected. Furthermore, the functions (1) and (2) have described as functions of time t. It should be understood, however, that the dynamic voltage may be changed responsive to the changing electric field within the region of interest. The changing electric field is due, at least in part, to incident radiation. As such, the dynamic voltage may be represented as varying as a function of one or more characteristics of the radiation, for example pulse rate, pulse width, pulse energy, radiation wavelength.

Figure 5:
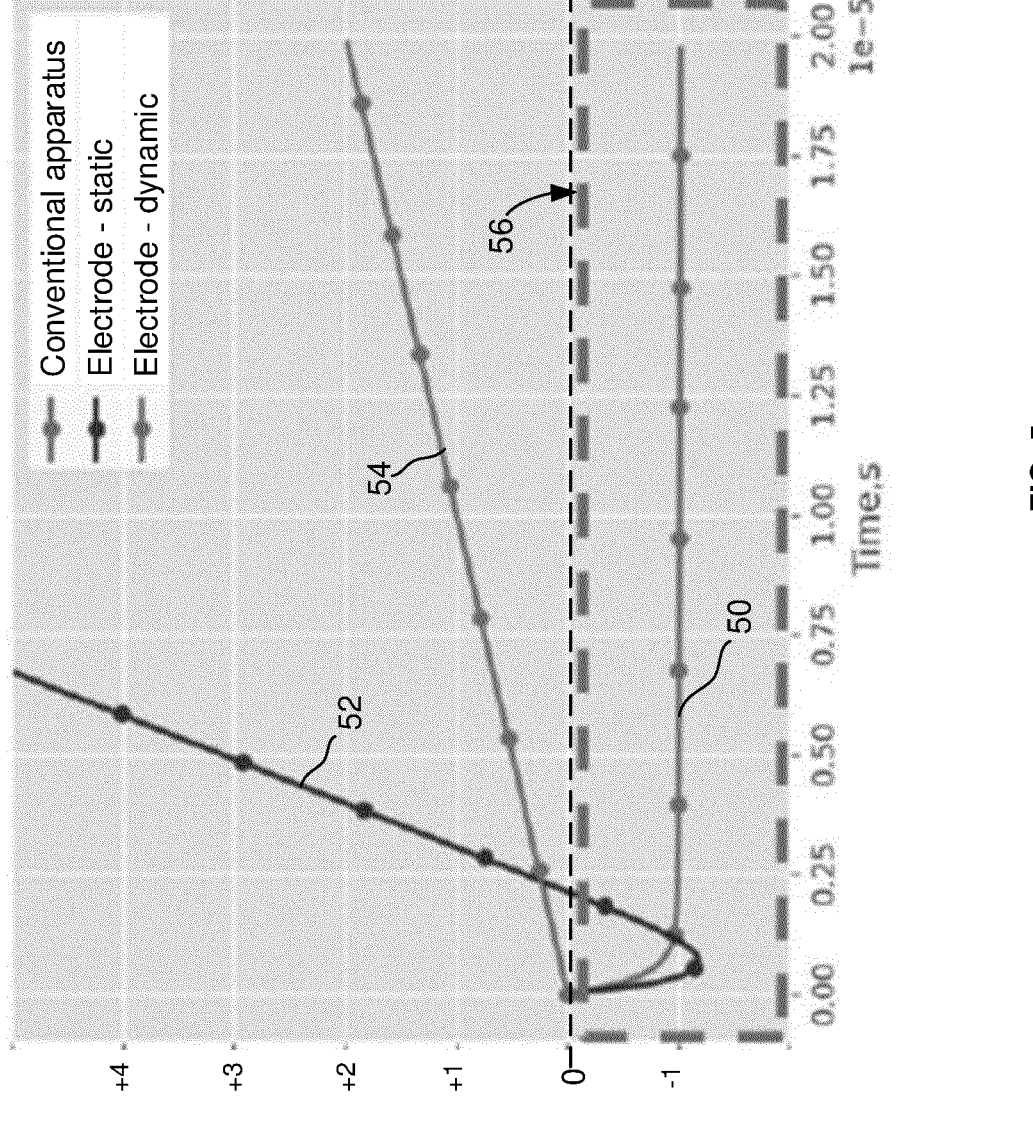
FIG. 5 shows curves representing the change in momentum of a contaminant in the plasma environment per unit charge.

FIG. 5 curves representing the change in momentum of a contaminant in the plasma environment per unit charge. The momentum change curves correspond to the electric field profiles depicted in FIG. 4. That is, a first curve 50 represents the momentum change for a contaminant in a region of interest of a conventional apparatus with no electrode, a second curve 52 represents the momentum change for a contaminant in a region of interest of an apparatus with an electrode which is biased with a static voltage, and a third curve 54 represents the momentum change for a contaminant in a region of interest of an apparatus with an electrode which is biased with a dynamic voltage.

An area 56 of negative momentum is indicated, outlined with a dashed box, representing momentum in a direction towards the patterning system. Conversely, a contaminant with positive momentum, in this frame of reference, travels away from the patterning system. With reference to FIGS. 2C and 2D, a negative momentum may be considered momentum in the positive z-direction and a positive momentum may be considered momentum in the negative z-direction.

The curves are shown for a window of time of 20 μs following a pulse of radiation arriving at the patterning system, which occurs at zero (0 μs). In the illustrated example, this is the approximate repetition rate of the radiation (i.e. the window shows momentum change for a single pulse of radiation followed by a pause where no radiation is delivered).

The first curve 50, representing a system with no electrode, is negative for the full window of 20 μs. That is, with no electrode, contaminants always travel towards the patterning system.

The second curve 52, representing static voltage application to an electrode, depicts a negative momentum for approximately 2 μs. As such, when a static voltage is applied, for the first 2 μs contaminants continue to travel towards the patterning device. This corresponds to the electric field profile 42 depicted in FIG. 4, wherein the electric field is negative for a short period of time following arrival of the radiation pulse. The second curve 52 peaks around 1 μs, indicating that the momentum change provided to contaminants reduces in magnitude, and continues to reduce until it reaches zero around 2 μs. Beyond 2 μs, the second curve becomes positive and increases in magnitude rapidly. Therefore, the contaminants are provided with enough steering by the electrode that they change direction after 2 μs and travel towards the electrode with increasing rapidity as time passes.

The third curve 54, representing dynamic voltage application to an electrode, is constantly positive. The third curve 54 increases in magnitude generally linearly for the full window of time shown. As such, contaminants in a reticle mini environment with an electrode to which this dynamic voltage is applied may be always steered away from the patterning system.

In the above discussion, the average momentum is considered. It should be understood that a population of particles comprise a statistical spread of momenta and, as such, not every particle in a population will react as described. However, the statistically average particle should behave a described. As such, one or more particles may travel to the patterning device when a dynamic voltage is applied, but the majority of particles are steered away from the patterning device.

The effects of momentum imparted to contaminants is cumulative as additional pulses of radiation illuminate the plasma environment. That is, at the end of the 20 μs window depicted in FIG. 5, the momentum per unit charge for both the static case and the dynamic case are non-zero. When considering the momentum change due to a second pulse of radiation, the contaminants begin with these non-zero momenta and gain additional momentum due to the electric field provided by the electrode. As such, the effects of contaminant steering increase over time (as a function of number of pulses). Due to this cumulative effect, the voltage provided to the electrode may be even lower, as even a low voltage will provide a substantial steering effect on particles after multiple pulses of radiation.

Figure 6:
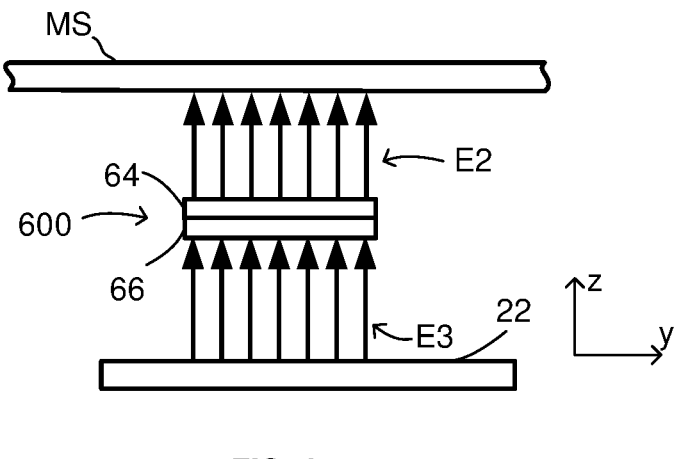
FIG. 6 schematically depicts an example electrode of a contamination reduction system according to an embodiment of the invention.

FIG. 6 schematically depicts an example electrode 600 of a contamination reduction system according to an embodiment of the invention. The electrode 600 is provided between the shutter 22 and the patterning system MS. The electrode 600 comprises a first portion 64 and a second portion 66. The first and second portions 64, 66 are electrically isolated from each other. The first and second portions 64, 66 are each connected to a voltage supply (not shown). The first and second portions 64, 66 may be connected to a single voltage supply with two outputs or two separate voltage supplies.

A first voltage is provided to the first portion 64 such that an electric field E2 is generated between the electrode 600 and the patterning system MS. The first voltage (and hence the electric field E2) is such that negatively charged contaminants are attracted by the first portion 64 of the electrode 600. As such, contaminants may be steered away from the patterning system MS due to the force exerted by the electric field E2.

A second voltage is provided to the second portion 66 such that an electric field E3 is generated between the electrode 600 and the shutter 22. The second voltage (and hence the electric field E3) is such that negatively charged contaminants are steered away from the second portion 66 of the electrode 600. As such, contaminants may be steered further away from the patterning system MS due to the force exerted by the electric field E3.

The electrode may be employed with any size and shape given the volume requirements of the given plasma environment and/or lithographic apparatus. One shape electrode of interest is a flat electrode, wherein the electrode is substantially plane parallel to the patterning device. In this arrangement, the electrode may have a thickness substantial enough to avoid mechanical damage due to induced electric fields. For example, induced field forces of approximately 0.4 µN may be experienced by an electrode in an example lithographic apparatus. An electrode with a thickness on the order of mm or smaller may be selected as such induced forces may be considered negligible. The electrode may be located in a plane parallel to the shutter.

The electrode may have a similar shape to a shutter. For example, the electrode and shutter may be complementary in shape. The electrode may have a shape that is substantially the same as the shutter but be slightly smaller in cross-section than the shutter. As such, the electrode may typically remain in the shadow of the shutter (i.e. the shutter may always inhibit the radiation beam from illuminating the electrode).

The electrode may be mounted separate to the patterning system and/or its support. As such, the electrode will not move with the patterning system. The electrode may rather be mounted upon, or mechanically coupled to, a shutter. By being mounted with or mechanically coupled to a shutter, the electrode may be moved with the shutter. In this arrangement, the electrode may always be shielded from the radiation beam by the shutter regardless of the movement of the shutter.

It will be appreciated that many features in figures (e.g. wiring and voltage sources) are omitted for simplicity.

The reticle mini environment RME depicted in the figures herein is illustrative in nature and should not be considered as explicitly representing a specific volume. Rather, the reticle mini environment RME is illustrated to show a general region in the vicinity of the reticle and should be understood as such. Various features described herein may be arranged in accordance with the claims set out below, and their location is not limited by reference to any reticle mini environment RMW depicted herein. Furthermore, the plasma environment described herein may extend through any portion of an apparatus, and is not limited to the reticle mini environment RME. The plasma environment is defined as a volume in which a plasma is formed.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a mask (or other patterning device). These apparatus may be generally referred to as lithographic tools. Such a lithographic tool may use vacuum conditions or ambient (non-vacuum) conditions.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims and clauses set out below.

1. A contamination reduction system for reducing contamination of a patterning system, comprising:
   a support arranged to hold a patterning system in a radiation beam;
   a shutter configured to shield a portion of the radiation beam from the patterning system; and
   an electrode positioned between the shutter and the support, the electrode connected to a voltage source and configured to generate an electric field between the electrode and the patterning system held by the support.

2. The contamination reduction system of clause 1, wherein the electrode is a single electrode.

3. The contamination reduction system of clause 1 or 2, wherein the electrode is separably mounted with respect the support.

4. The contamination reduction system of any preceding clause, wherein the electric field is less than 2 V/mm.

5. The contamination reduction system of any of any preceding clause, wherein the generated electric field is greater in magnitude than a predetermined value, the predetermined value representing a second electric field corresponding to an electric field at the patterning system when no voltage is applied to the electrode, and wherein the generated electric field and the second electric field are of opposite polarity.

6. The contamination reduction system of clause 5, further comprising means for measuring the electric field at the patterning system, and wherein the predetermined value comprises the measured electric field.

7. The contamination reduction system of clause 5 or 6, further comprising a memory for storing the predetermined value.

8. The contamination reduction system of any of clauses 5 to 7, wherein the predetermined value comprises a function which varies with time, wherein a voltage applied by the voltage supply varies with time and is selected in dependence on the predetermined value.

9. The contamination reduction system of any preceding clause further comprising a gas outlet configured to provide a gas to a surface of the patterning system arranged to be illuminated by the radiation beam.

10. The contamination reduction system of clause 9, wherein the gas outlet and electrode are unitary.

11. The contamination reduction system of any preceding clause, further comprising a cooling system configured to remove heat from the electrode.

12. The contamination reduction system of any preceding clause wherein the electrode comprises a flat surface extending generally parallel to the plane of the patterning system and/or shutter.

13. The contamination reduction system of any preceding clause wherein the electrode comprises a first portion and a second portion electrically isolated from the first portion.

14. A reticle stage comprising the contamination reduction system of any preceding clause.

15. A lithographic apparatus comprising the reticle stage of clause 14 and/or the contamination reduction system of clauses 1 to 13.

16. A method of preventing contamination of a patterning system, the patterning system held in a radiation beam and a portion of the patterning system being shielded by the radiation beam by a shutter, the method comprising applying a voltage to an electrode positioned between the shutter and the patterning system such that an electric field is generated between the electrode and the patterning system.

17. The method of clause 16, wherein the voltage applied is such that the generated electric field is greater in magnitude than a predetermined value, the predetermined value representing a second electric field corresponding to an electric field at the patterning system when no voltage is applied to the electrode, and wherein the generated electric field and the second electric field are of opposite polarity.

18. The method of clause 17, further comprising measuring the electric field at the patterning system when no voltage is applied to the electrode.

19. The method of any of clauses 16 to 18, wherein applying the voltage comprises applying a first voltage during a first time interval and applying a second voltage during a second time interval, wherein the first voltage and second voltage are different.

20. The method of clause 19, wherein the first voltage has a first polarity and the second voltage has a second polarity opposite the first polarity.

21. A metrology system for determining contamination characteristics in a plasma environment, comprising the contamination reduction system of any of clauses 1 to 13 and a sensing apparatus, the sensing apparatus operable to determine one or more characteristics of one or more contaminant particles on a surface of the electrode.

22. The metrology system of clause 21, wherein the characteristic comprises a volume and/or density and/or composition of the one or more contaminant particles.

The invention claimed is:

1. A contamination reduction system comprising:
a support arranged to hold a patterning system in a path of a radiation beam;
a movable shutter configured to shield a portion of the radiation beam from the patterning system; and
a single electrode coupled to the shutter and positioned between the shutter and the support, the electrode connected to a voltage source and configured to generate a first electric field between the electrode and the patterning system held by the support and a second electric field between the electrode and the shutter;
wherein the electrode is configured to move with the shutter such that the electrode is shielded from the radiation beam by the shutter.

2. The contamination reduction system of claim 1, wherein the first electric field and the second electric field are configured to steer contaminants toward the electrode and away from the patterning system and the shutter.

3. The contamination reduction system of claim 1, wherein the electrode is mounted separate from the support.

4. The contamination reduction system of claim 1, wherein:
the first electric field is greater in magnitude than a predetermined value, the predetermined value representing a third electric field corresponding to an electric field at the patterning system when no voltage is applied to the electrode, and
the first electric field and the third electric field are of opposite polarity.

5. The contamination reduction system of claim 4, further comprising a measuring device configured to measure the third electric field at the patterning system, and wherein the predetermined value comprises the electric field measurement.

6. The contamination reduction system of claim 4, further comprising a memory configured to store the predetermined value.

7. The contamination reduction system of claim 5, wherein:
the predetermined value comprises a function which varies with time, and
a voltage applied by the voltage supply varies with time and is selected in dependence on the predetermined value.

8. The contamination reduction system of claim 1, further comprising a gas outlet configured to provide a gas to a surface of the patterning system and arranged to be illuminated by the radiation beam.

9. The contamination reduction system of claim 8, wherein the gas outlet and electrode are unitary.

10. The contamination reduction system of claim 1, further comprising a cooling system configured to remove heat from the electrode.

11. The contamination reduction system of claim 1, wherein the electrode comprises a flat surface extending generally parallel to a plane of the patterning system and/or shutter.

12. The contamination reduction system of claim 1, wherein:
the electrode comprises a first portion and a second portion electrically isolated from the first portion;
the first portion is configured to generate the first electric field such that contaminants are attracted by the first portion; and
the second portion is configured to generate the second electric field such that contaminants are steered away from the second portion.

13. A reticle stage comprising the contamination reduction system of claim 1.

14. A lithographic apparatus comprising the reticle stage of claim 13.

15. A method comprising:
moving a single electrode coupled to a shutter to a location of a patterning system, wherein the electrode is positioned between the shutter and the patterning system;
illuminating the patterning system with a radiation beam such that the shutter shields a portion of the radiation beam from the patterning system and the electrode; and
applying a voltage to the electrode such that a first electric field is generated between the electrode and the patterning system and a second electric field is generated between the electrode and the shutter.

16. The method of claim 15, wherein:
the voltage applied is such that the first electric field is greater in magnitude than a predetermined value, the predetermined value representing a third electric field corresponding to an electric field at the patterning system when no voltage is applied to the electrode, and
the first electric field and the third electric field are of opposite polarity.

17. The method of claim 16, further comprising measuring the third electric field at the patterning system when no voltage is applied to the electrode.

18. The method of claim 15, wherein:
applying the voltage comprises applying a first voltage during a first time interval and applying a second voltage during a second time interval, and the first voltage and second voltage are different.

19. A metrology system comprising:

a contamination system configured for determining contamination characteristics in a plasma environment, the contamination system comprising:

a support arranged to hold a patterning system in a path of a radiation beam;

a movable shutter configured to shield a portion of the radiation beam from the patterning system; and a single electrode coupled to the shutter and positioned between the shutter and the support, the electrode connected to a voltage source and configured to generate a first electric field between the electrode and the patterning system held by the support and a second electric field between the electrode and the shutter;

wherein the electrode is configured to move with the shutter such that the electrode is shielded from the radiation beam by the shutter; and a sensing apparatus, the sensing apparatus being operable to determine one or more characteristics of one or more contaminant particles on a surface of the electrode.

20. The metrology system of claim 19, wherein the one or more characteristics comprises a volume, density, and/or composition of the one or more contaminant particles.

21. A lithographic apparatus comprising the contamination reduction system of claim 1.

\*   \*   \*   \*   \*